United States Patent
Mani et al.

(10) Patent No.: US 10,244,121 B2
(45) Date of Patent: Mar. 26, 2019

(54) AUTOMATIC TUNING OF A GAIN CONTROLLER

(71) Applicant: Imagination Technologies Limited, Kings Langley (GB)

(72) Inventors: Senthil Kumar Mani, Hyderabad (IN); Anupama Ghantasala, Hyderabad (IN)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/928,205

(22) Filed: Oct. 30, 2015

(65) Prior Publication Data

US 2016/0127561 A1 May 5, 2016

(30) Foreign Application Priority Data

Oct. 31, 2014 (GB) .................................. 1419477.3

(51) Int. Cl.
| | |
|---|---|
| H04M 9/08 | (2006.01) |
| H04M 3/00 | (2006.01) |
| H04B 3/23 | (2006.01) |
| H03G 3/32 | (2006.01) |

(52) U.S. Cl.
CPC .............. *H04M 9/082* (2013.01); *H03G 3/32* (2013.01); *H04B 3/23* (2013.01); *H04M 3/002* (2013.01); *H04M 9/08* (2013.01)

(58) Field of Classification Search
CPC ........ H04M 9/082; H04M 3/002; H04M 9/08; H04B 3/234; H04B 3/23; H03G 3/23
See application file for complete search history.

(56) References Cited

U.S. PATENT DOCUMENTS

| | | |
|---|---|---|
| 5,313,498 A | 5/1994 | Sano |
| 5,909,489 A | 6/1999 | Matt et al. |
| 6,381,224 B1 | 4/2002 | Lane et al. |
| 6,434,110 B1 | 8/2002 | Hemkumar |
| 6,804,203 B1 * | 10/2004 | Benyassine ........... H04M 9/082 370/286 |

(Continued)

FOREIGN PATENT DOCUMENTS

| | | |
|---|---|---|
| GB | 2225517 A | 5/1990 |
| WO | 2010/065501 A1 | 6/2010 |

OTHER PUBLICATIONS

Senthil Kumar Mani and Bala Manikya Prasad, "Projection Based Near-end Speech Detectors for Time Domain Adaptive Echo Cancellation," in International Journal of Recent Trends in Engineering, vol. 1, No. 3, May 2009, India.

(Continued)

*Primary Examiner* — Lisa Hashem
(74) *Attorney, Agent, or Firm* — Vorys, Sater, Seymour and Pease LLP; Vincent M DeLuca

(57) ABSTRACT

A gain control system for applying gain to a far-end signal, the system comprising: a signal identifier configured to detect an echo of the far-end signal in a microphone signal; and a path estimator configured to estimate a characteristic of an echo path of the detected echo, wherein: the signal identifier is further configured to detect a near-end signal from the microphone signal; and in response to detecting the near-end signal, the gain control system is configured to adjust the gain applied to the far-end signal in dependence on the estimated characteristic of the echo path.

18 Claims, 6 Drawing Sheets

(56) References Cited

U.S. PATENT DOCUMENTS

| | | | | |
|---|---|---|---|---|
| 7,072,465 | B1* | 7/2006 | Benesty | H04B 3/234 370/286 |
| 7,599,432 | B2* | 10/2009 | Pessoa | H03H 21/0012 370/290 |
| 8,275,139 | B2 | 9/2012 | Kumar et al. | |
| 8,565,415 | B2* | 10/2013 | Schmidt | H04M 9/082 379/390.03 |
| 8,774,399 | B2* | 7/2014 | Khanduri | H04M 9/082 379/406.08 |
| 9,881,632 | B1* | 1/2018 | Every | H04M 9/082 |
| 2002/0061012 | A1* | 5/2002 | Thi | H04B 3/23 370/352 |
| 2002/0101830 | A1* | 8/2002 | LeBlanc | H04B 3/23 370/286 |
| 2003/0031314 | A1* | 2/2003 | Tanrikulu | H04M 9/082 379/406.01 |
| 2003/0076948 | A1* | 4/2003 | Nishimura | H04M 9/082 379/406.01 |
| 2008/0247535 | A1 | 10/2008 | Li et al. | |
| 2009/0067615 | A1 | 3/2009 | Strandberg | |
| 2009/0089054 | A1* | 4/2009 | Wang | H04M 9/082 704/233 |
| 2009/0245502 | A1* | 10/2009 | Liu | H04B 3/234 379/406.08 |
| 2009/0245527 | A1* | 10/2009 | Kumar | H04M 9/082 381/66 |
| 2010/0063809 | A1* | 3/2010 | Trump | H04M 9/082 704/228 |
| 2010/0278351 | A1* | 11/2010 | Fozunbal | H04M 9/082 381/66 |
| 2011/0081026 | A1* | 4/2011 | Ramakrishnan | G10L 21/0208 381/94.3 |
| 2011/0150067 | A1* | 6/2011 | Takada | H04M 9/082 375/227 |
| 2012/0201370 | A1* | 8/2012 | Mazurenko | H04B 3/23 379/406.1 |
| 2012/0250872 | A1* | 10/2012 | LeBlanc | H04M 9/082 381/71.1 |
| 2012/0294437 | A1* | 11/2012 | Haddad | H04M 9/082 379/406.05 |
| 2012/0328117 | A1* | 12/2012 | Gautama | H03F 1/52 381/59 |
| 2013/0003960 | A1 | 1/2013 | Sollenberger et al. | |
| 2013/0163698 | A1 | 6/2013 | Volcker et al. | |
| 2013/0329882 | A1* | 12/2013 | Laturell | H04M 9/082 379/406.08 |
| 2014/0064476 | A1* | 3/2014 | Mani | H04M 9/082 379/406.08 |
| 2015/0011266 | A1* | 1/2015 | Feldt | H04M 9/082 455/570 |
| 2015/0249885 | A1* | 9/2015 | Kawabata | H04B 3/231 381/66 |
| 2015/0288807 | A1* | 10/2015 | Mani | H04M 9/082 379/406.07 |
| 2015/0288826 | A1* | 10/2015 | Mani | H04M 9/08 379/406.08 |
| 2015/0294675 | A1* | 10/2015 | Hammarqvist | G10L 21/0208 704/226 |
| 2015/0371657 | A1* | 12/2015 | Gao | G10K 11/16 381/66 |
| 2016/0086618 | A1* | 3/2016 | Neoran | H04M 9/08 704/205 |
| 2016/0127527 | A1* | 5/2016 | Mani | G10L 21/0216 379/388.07 |
| 2016/0171988 | A1* | 6/2016 | Vos | G10L 21/0205 704/226 |
| 2016/0225385 | A1* | 8/2016 | Hammarqvist | G10L 21/0208 |
| 2017/0011753 | A1* | 1/2017 | Herbig | H04R 3/00 |
| 2017/0103774 | A1* | 4/2017 | Sorensen | H04M 9/082 |

OTHER PUBLICATIONS

Senthil Kumar Mani and Bala Manikya Prasad, "Methods for Modeling a Clear Echo Path in Accelerated Adaptive Filter by de-correlation," in Third Innovative Conference on Embedded Systems, Mobile Communication and Computing, Aug. 11-14, 2008, Infosys, Mysore, India.

Senthil Kumar Mani, "Low delay nearend speech detector for acoustic echo cancellation," TENCON 2008—2008 IEEE Region 10 Conference, Nov. 19-21, 2008, Hyderabad, India.

R. A. Sukkar, "Echo detection and delay estimation using a pattern recognition approach and cepstral correlation", Proc. IEEE Int. Conf. Acoust., Speech, Signal Process., vol. IV, pp. 909-912 ,2007.

R.A. Dyba, "Parallel Structures for Fast Estimation of Echo Path Pure Delay and Their Applications to Sparse Echo Cancellers", In Proceedings of CISS 2008, 42nd Annual Conference on Information Sciences and Systems, article ID 10.1109/CISS.2008.4558529, Mar. 2008, pp. 241-245.

H. Ye and B.X. Wu, "A new double-talk detection algorithm based on the orthogonality theorem", IEEE Trans. Comm., vol. 39, No. 11, pp. 1542-1545, Nov. 1991.

Van Waterschoot, T., "Double-Talk-Robust Prediction Error Identification Algorithms for Acoustic Echo Cancellation", IEEE Trans. Signal Processing., vol. 55, issue 3, pp. 846-858, Mar. 2007.

J. Chao and S. Tsujii "A New Configuration for Echo Canceller Adaptable During Double Talk Periods", IEEE Trans. on Comm., vol. 37, No. 9, 1989.

E. A. Wan and R. Van Der Merwe, "The unscented Kalman filter for nonlinear estimation," in Adaptive Systems for Signal Processing, Communications, and Control Symposium 2000. AS-SPCC. The IEEE 2000, 2000, pp. 153-158.

M. Y. Li, I. Galton, L. E. Larson, and P. M. Asbeck, "Correlation techniques for estimation of amplifier nonlinearity," Radio and Wireless Conference, 2004 IEEE, pp. 179-182.

Das, A. and Miller, M.J., "Remote non-linearity detection via burst power dithering and EM based SNR Estimation," International Workshop on Satellite and Space Communications, 2007. IWSSC '07, Sep. 13-14, 2007, pp. 216-220.

\* cited by examiner

AUTOMATIC TUNING OF A GAIN CONTROLLER

BACKGROUND

This invention relates to an apparatus and method for controlling the gain applied to a far-end audio signal in bidirectional voice communications.

In telephony, audio signals (e.g. including voice signals) are transmitted between a near-end and a far-end. In a bidirectional voice communication, the "near-end" and "far-end" are defined relative to each participant. Thus, the "near-end" for one participant will correspond to the "far-end" for the other participant. Far-end signals which are received at the near-end may be outputted from a loudspeaker at the near-end. A microphone at the near-end may be used to capture a near-end signal to be transmitted to the far-end, such as a voice of a participant at the near-end. An "echo" occurs when at least some of the far-end signal outputted by the loudspeaker at the near-end is included in the near-end signal which is transmitted back to the far-end. In this sense, the echo may be considered to be a reflection of the far-end signal.

An example scenario is illustrated in FIG. 1, which shows a signal being captured by a far-end microphone and output by a near-end loudspeaker. The echo is a consequence of acoustic coupling between the loudspeaker and a microphone at the near-end; the near-end microphone captures the signal originating from its own loudspeaker in addition to the voice of the near-end speaker and any near-end background noise. The result is an echo of the far-end signal at the far-end loudspeaker. Echo cancellation is an important feature of telephony. Hands-free devices and teleconferencing, in particular, require echo cancellation that can adapt to environments having a wide range of acoustic characteristics. In these examples, a combination of factors contributes to echo being more of an issue. First, the volume at which the far-end signal is outputted from the near-end loudspeaker is typically loud enough that the far-end signal is a significant part of the signal captured by the near-end microphone. Second, the physical arrangement of the loudspeaker and microphone in these types of arrangements tends to result in a good acoustic coupling between the two.

Acoustic echo cancellers typically synthesise an estimate of the echo from the far-end voice signal. The estimated echo is then subtracted from the microphone signal. This technique requires adaptive signal processing to generate a signal accurate enough to cancel the echo effectively. An adaptive filter is often used to model the environment's acoustic impulse response. The adaptive filter is often followed by a non-linear processor (NLP) for removing any residual echo.

The performance of the echo canceller depends on the platform, and particularly on the audio interface, the interface driver and related hardware, the pre and post amplifier (if any), and characteristics of microphone and speaker. It is challenging to achieve full duplex voice communication on a wide variety of platforms with sufficient echo cancellation. The echo cancellation can be particularly challenging on platforms that are highly non-linear. The processing carried out in order to cancel echoes in highly non-linear platforms can be resource intensive and, in some situations, such as at times of double talk, cause cancellation of the near-end microphone speech along with the echoes, which results in severe degradation in the quality of a near-end signal received at the far-end, e.g. during double talk.

Therefore, there is a need for a method of improving the quality of the near-end signal when implementing acoustic echo cancellation.

SUMMARY OF THE INVENTION

According to a first aspect of the disclosure, there is provided a gain control system for applying gain to a far-end signal, the system comprising: a signal identifier configured to detect an echo of the far-end signal in a microphone signal; and a path estimator configured to estimate a characteristic of an echo path of the detected echo, wherein: the signal identifier is further configured to detect a near-end signal from the microphone signal; and in response to detecting the near-end signal, the gain control system is configured to adjust the gain applied to the far-end signal in dependence on the estimated characteristic of the echo path.

The gain control system may be configured to reduce the applied gain in response to the detecting the near-end signal.

The gain control system may be configured to increase the applied gain from the reduced gain in response to detecting an absence of the near-end signal.

The gain may be reduced at a first rate and increased at a second rate, the first rate being greater than the second rate.

The applied gain may be increased to a default gain value.

The path estimator may be configured to correlate the detected echo signal with the far-end signal so as to determine a measure of similarity between the signals.

The characteristic may be estimated in dependence on the measure of similarity.

The characteristic may be a degree of non-linearity of the echo path.

The gain may be reduced so as to output a far-end signal having, in dependence on the degree of non-linearity, a predetermined power.

The characteristic may be a variation of a delay in the echo path over time.

Echo presence may be detected during echo-only periods.

Near-end signal may be detected during double talk.

The gain control system may be configured to control a volume of the far-end signal to be outputted by a loudspeaker.

According to a second aspect of the disclosure, there is provided a method for applying gain to a far-end signal, the method comprising: detecting an echo of the far-end signal in a microphone signal; estimating a characteristic of an echo path of the detected echo; detecting a near-end signal from the microphone signal; and in response to detecting the near-end signal, adjusting the gain applied to the far-end signal in dependence on the estimated characteristic of the echo path.

The applied gain may be reduced in response to the detecting the near-end signal.

The applied gain may be increased from the reduced gain in response to detecting an absence of the near-end signal.

The gain may be reduced at a first rate and increased at a second rate, the first rate being greater than the second rate.

The applied gain may be increased to a default gain value.

The step of estimating a characteristic of an echo path may comprise correlating the detected echo signal with the far-end signal so as to determine a measure of similarity between the signals.

The characteristic may be estimated in dependence on the measure of similarity.

The characteristic may be a degree of non-linearity of the echo path.

The gain may be reduced so as to output a far-end signal having, in dependence on the degree of non-linearity, a predetermined power.

The characteristic may be a variation of a delay in the echo path over time.

The echo may be detected during echo-only periods.

The near-end signal may be detected during double talk.

The gain may be applied to the far-end signal so as to control a volume of the far-end signal to be outputted by a loudspeaker.

According to a third aspect of the disclosure, there is provided machine readable code for generating a gain control system as described above.

According to a fourth aspect of the disclosure, there is provided a machine readable storage medium having encoded thereon non-transitory machine-readable code for generating a gain control system as described above.

According to a fifth aspect of the disclosure, there is provided machine readable code for implementing a method as described above.

According to a sixth aspect of the disclosure, there is provided a machine readable storage medium having encoded thereon non-transitory machine-readable code for implementing a method as described above.

BRIEF DESCRIPTION OF THE DRAWINGS

The present invention will now be described by way of example with reference to the accompanying drawings. In the drawings.

DETAILED DESCRIPTION OF THE INVENTION

Often the main source of signal energy in the microphone signal at the near-end will be an echo of the far-end signal outputted by the loudspeaker at the near-end; there is no other source of significant signal energy at the near-end. This is denoted "single talk" herein. At other times, the microphone signal will contain significant signal energy that is independent of any echo. In many instances this will be due to talking at the near-end, and is denoted as the "near-end signal" herein. The signal energy might, of course, be due to a different source than talking. This is particularly the case during teleconferencing or hands-free operation. The term "near-end signal" is therefore used to refer to any significant signal energy generated at the near-end that is not due to a far-end signal output from a loudspeaker. Sometimes, the microphone signal will contain the echo of the far-end signal and the near-end signal. This is denoted "double talk" herein. The microphone signal may also contain some near-end ambient noise.

Figure 1:
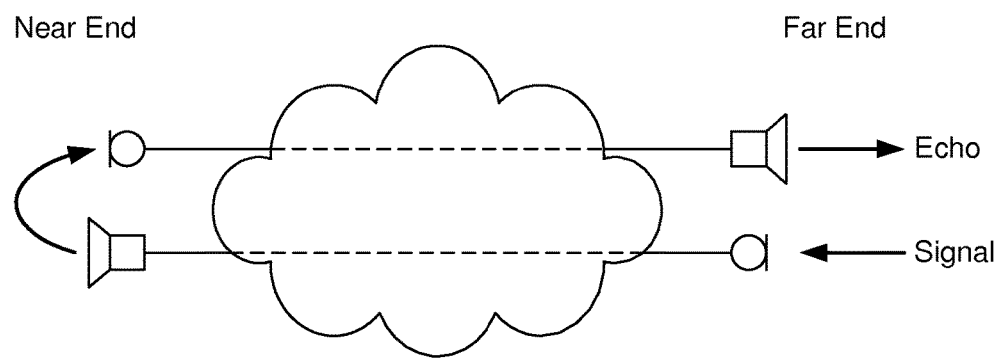
FIG. 1 shows an example of near-end and far-end in telephony.
Figure 2:
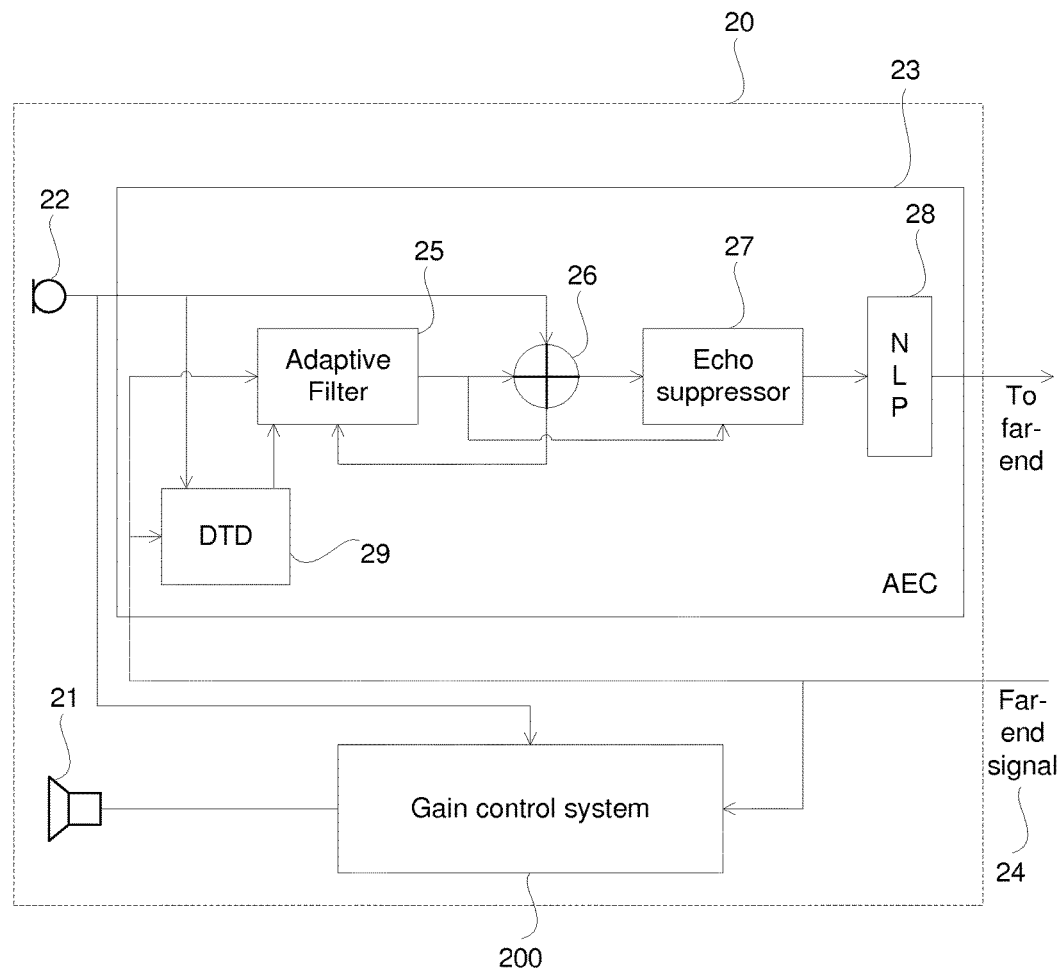
FIG. 2 shows an architecture of a communication device comprising an acoustic echo canceller and a gain control system.

FIG. 2 shows example of a communication device 20 comprising a loudspeaker 21, microphone 22 and an acoustic echo canceller (AEC) 23. In an alternative arrangement (not shown), the loudspeaker 21 and microphone 22 may be external to the device 20 and connected to the device 20 via appropriate output and input ports. Examples of suitable communication devices 20 include mobile phones, smart phones, line connected phones, laptops, tablets, teleconferencing equipment etc. The communication device 20 may also include a CPU, memory, signal processing circuitry, such as a DSP and filters, etc. (none of which are shown in FIG. 2 for simplification of explanation).

The AEC 23 is configured to receive a microphone signal from the microphone 22. It is also configured to receive a far-end signal 24 from a far-end communication device. In general terms, the AEC 23 is configured to process the signal 24 from the far-end to generate an estimated echo signal. The echo estimate is generated by adaptive filter 25, which effectively attempts to synthesise the real-world acoustic path between the loudspeaker 21 (which outputs the far-end signal) and the microphone 22 (which receives the output of the loudspeaker 21 along with any near-end signal). The real-world echo is thus one of the possible signal components of the microphone signal.

The adaptive filter 25 continuously models the acoustic path and generates an echo estimate from the far-end signal. The echo estimate is then subtracted from the microphone signal by a subtraction unit 26. Assuming the echo estimate is relatively accurate, this provides a substantially echo-free signal for transmission to the far-end. In an echo-alone region there is no wanted sound in the microphone signal, i.e. the microphone signal can be considered to include only the echo from the far-end and some unwanted sound such as noise. In an echo-alone region, any signal remaining after the subtraction is assumed to represent an error in the synthesised echo, and it is fed back to the adaptive filter 25 to update its model of the acoustic echo path.

The AEC shown in FIG. 2 also includes an echo suppressor 27, a non-linear processor 28 and a double-talk detector 29.

The double-talk detector 29 detects the presence of double-talk. It may also detect the presence of a near-end signal only (i.e. without any significant far-end signal). It is preferably configured to cause adaptation of the adaptive filter 25 on the basis of far-end speech to be stopped when near-end speech is detected because the near-end speech will cause errors in the echo estimation process for estimating the echo in the microphone signal. The echo suppressor 27 and non-linear processor 28 are configured to deal with any residual echo or noise, after the estimated echo has been subtracted from the microphone signal. The residual echo can be quite strong. For example, if the acoustic or echo path between the loudspeaker 21 and the microphone 22 changes dramatically during a period of near-end speech, tracking of the echo path changes by the adaptation filter 25 may be inhibited by the double-talk detector 29, potentially leading to a strong residual echo. The echo suppressor 27 attenuates the residual echo in dependence on the estimated echo. The non-linear processor 28 removes any remaining residual error by clipping.

The non-linear processor 28 is typically configured to remove any signal energy below a threshold that remains in the microphone signal after the echo estimate has been subtracted from it. The threshold therefore determines how much energy the non-linear processor 28 removes from the microphone signal before it is transmitted to the far-end. If the threshold is low, the non-linear processor 28 effectively just removes any remnants of the echo that remain because the adaptive filter 25 has not perfectly modelled the echo path. If the threshold is high, however, the non-linear processor 28 effectively blocks any signal from the near-end. This means that controlling the threshold effectively controls a mode of operation of the communication device 20. When the threshold is low, the communication device 20 operates in full duplex mode by permitting signals to travel in both directions. When the threshold is high, the communication device 20 effectively operates in half-duplex mode by permitting signals to travel in one direction only (i.e. from the far-end to the near-end). Thus, during double talk, the non-linear processor 28 efficiently blocks the echo and the near-end signal (e.g. talking). This can lead to problems in the quality of the near-end signal received at the far-end and variation in the threshold, as double talk commences and ceases, which leads to chopping of the near-end signal.

Figure 3:
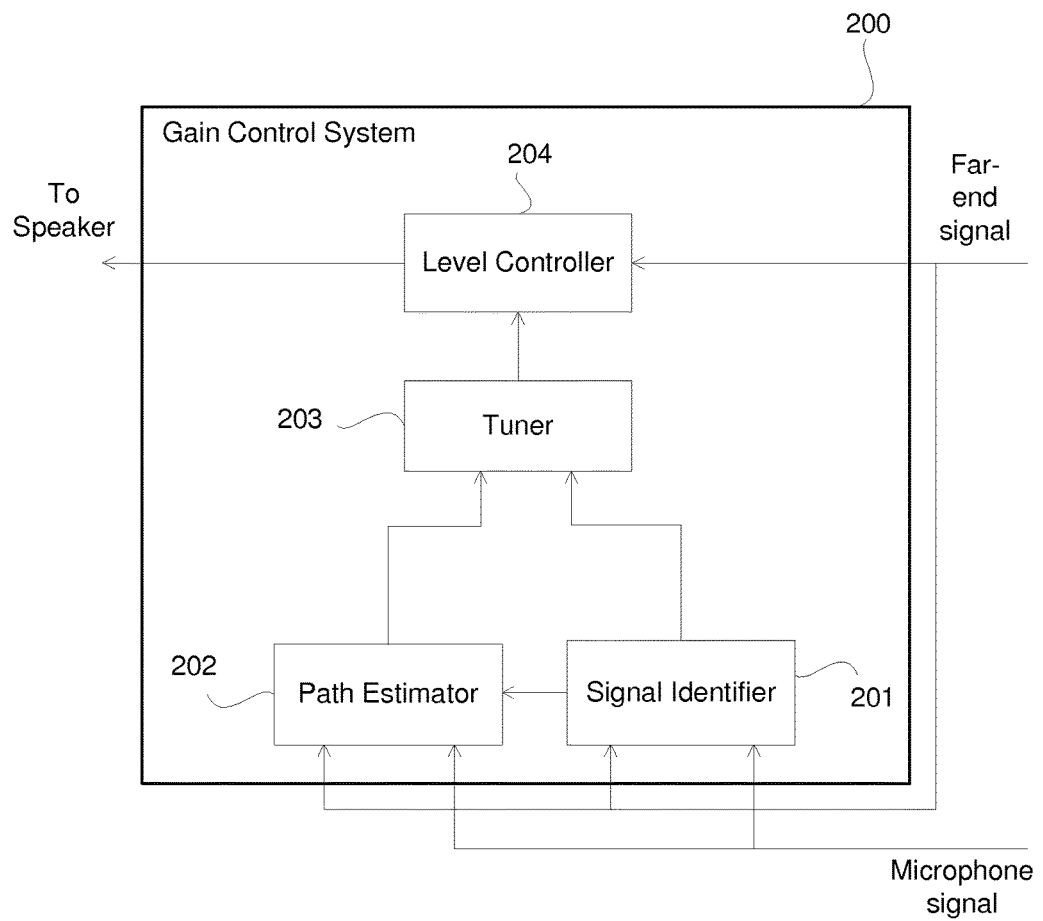
FIG. 3 shows an architecture of an exemplary gain control system.

The communication device 20 comprises a gain control system 200 (which is shown in further detail in FIG. 3) provided in the path between the far-end signal 24 and the loudspeaker 21. The gain control system 200 provides the far-end signal 24 to loudspeaker 21 and can control the power (i.e. thereby controlling the volume) of the far-end signal outputted by loudspeaker 21. As shown in FIG. 3, the gain control system 200 comprises a signal identifier 201, a path estimator 202, a gain tuner 203 and a level controller 204, each of which may be implemented in hardware, software or a combination thereof.

The far-end signal is received by the gain control system 200 and provided to the level controller 204, which controls the power level of the far-end signal that is outputted by the system 200 and provided to the loudspeaker. The tuner 203 provides the controller 204 with a target power level, which is the desired power level (e.g. an average RMS level) of the signal that is to be outputted by the controller 204. The controller 204 applies an appropriate amount of gain to the inputted far-end signal in order to output the far-end signal at the desired target power level.

The tuner 203 may provide the controller 204 with a default target power level during single talk. The tuner 203 is capable of dynamically adapting the target power level (and thus the gain applied to the far-end signal) during reception of a near-end signal (which includes double talk) to help overcome the problems mentioned above. The tuner 203 adapts the power level in dependence on information from the signal identifier 201 and the path estimator 202. The signal identifier 201 helps identify echo only periods (in which a significant far-end signal is received but no significant near-end signal is received), near-end signal periods (in which a significant near-end signal is received but no significant far-end signal is received) and periods of double talk (in which a significant far-end and near-end signals are received). The path estimator 202 estimates the degree of non-linearity of the echo path, as described in further detail below. A process is described further below for adapting the target power level based, at least in part, on the degree of non-linearity of the echo path.

Figure 4:
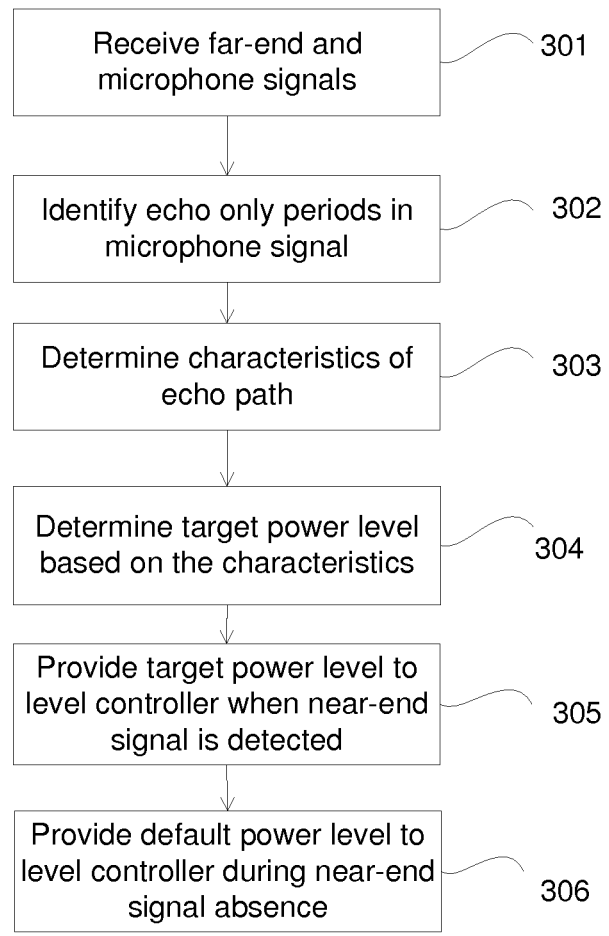
FIG. 4 shows an exemplary process for tuning gain to optimise the quality of a near-end signal.

FIG. 4 is a flow diagram outlining the process carried out by the gain control system 200 to adapt the target power level and optimise the quality of the near-end signal that is received at a far-end device.

At step 301, the far-end and microphone signals are received by the signal identifier 201. At step 302, the signal identifier 201 identifies one or more periods of the microphone signal that are of echo-only without any significant near-end signal (such as talking). As described in more detail below with reference to FIG. 5, the echo-only periods are identified by comparing a delayed version of the far-end signal with the microphone signal, and if the differences are small (e.g. below a threshold) then an echo-only period is identified, whereas if the differences are large (e.g. above a threshold) then this indicates that the microphone signal includes significant non-echo components (e.g. near-end speech), so the period is not identified as an echo-only period. At step 303, characteristics of the echo path, such as its non-linearity or delay variation, are determined from the echo only periods. At step 304, a target power level is determined based on the characteristics of the echo path. The target power level is suitable for use by the controller 204 during periods of near-end activity (e.g. during double talk periods). However, the target power level is determined based on characteristics of the echo path which can be most easily determined (in step 303) during echo-only periods. The target power level determined in step 304 may be different to (e.g. less than) a default target power level which is suitable for use by the controller 204 during echo-only periods. At step 305, when a near-end signal or double talk is detected, the tuner 203 provides the controller 204 with the target power level determined at step 304. At step 306, when the near-end signal ends (and during any periods when the near-end signal is absent), the tuner 203 provides the controller 204 with a default target power level.

Using this process when there is a near-end signal, the power of the far-end signal is reduced to a level dependant on the characteristics of the echo path, such as the non-linearity of the platform, so that the quality of the near-end signal is not degraded, especially during double talk, by the NLP of an echo canceller blocking the near-end signal. Each of the steps are described in further detail below. For example, when a near-end user is speaking, the gain applied to far-end speech outputted from the near-end loudspeaker is reduced so that the echo in the microphone signal is reduced. This means that the amount of echo cancellation applied is reduced such that the degradation to the near-end signal caused by the echo cancellation is reduced. Therefore, the near-end signal which is sent to the far-end is of higher quality.

Figure 5:
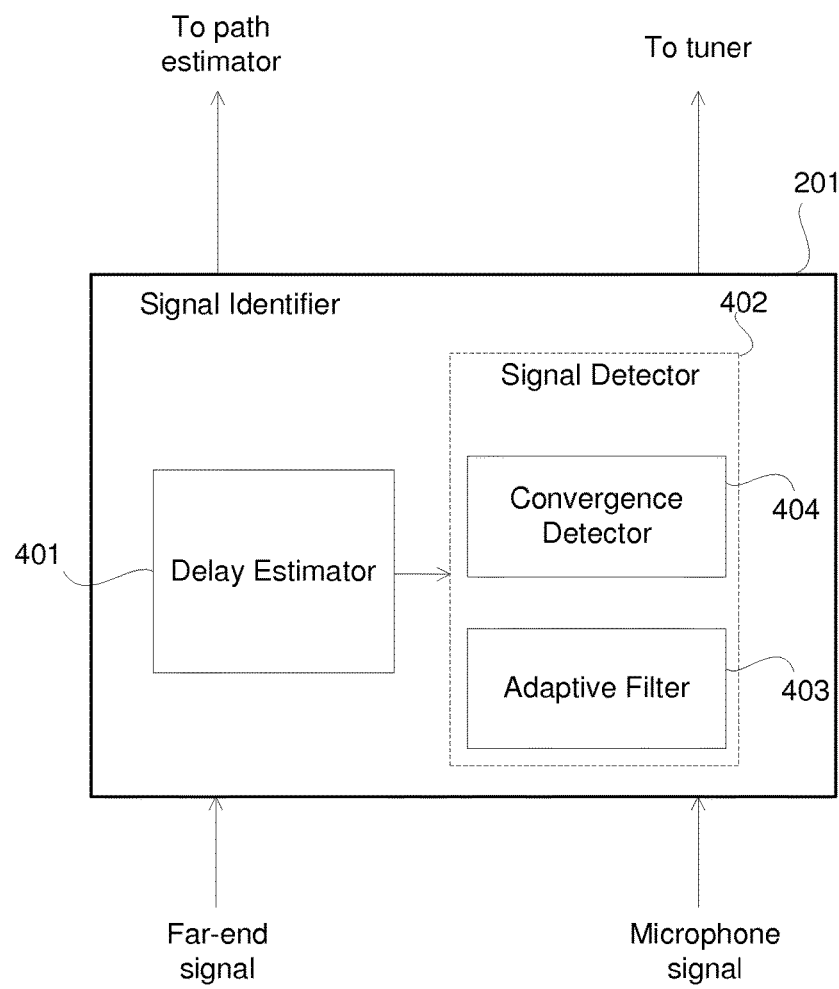
FIG. 5 shows an architecture of an exemplary signal identifier.

FIG. 5 shows a signal identifier 201 according to one example embodiment. The signal identifier comprises an echo delay estimator 401 and a signal detector 402.

The echo delay estimator 401 estimates the delay of the echo path. Preferably, the estimation of the delay is carried out during echo only periods. Broadly, the delay estimator 401 compares a historical record of the far-end signal with the microphone signal to find a matching sample of the signals. The echo path delay is based on the time difference between the historical record of the far-end signal and the matched microphone signal.

One specific method of estimating the delay path is now described. The delay estimator 401 converts each frame of the microphone signal and far-end signal to the frequency domain using, e.g., a 64 point Fast Fourier Transform (FFT). A short term average and long term average is calculated for every frequency bin. From the short term and long term average, a binary spectrum is estimated for every frequency bin of the microphone and far-end signal. If the short term average exceeds the long term average of a respective frequency bin by a predefined threshold, the binary spectrum representation of that frequency bin is designated to be one, else zero.

A history of far-end binary spectra is maintained, e.g., in memory (not shown). The history may be, for example, the far-end binary spectra for the most recent 50 frames. A binary spectrum of the microphone signal (e.g. of the most recent single talk frame) is compared with each historical binary spectrum of the far-end signal to find the best matching spectra. To find the best match, an AND operation of each frequency bin for the microphone binary spectrum is carried out with corresponding frequency bins of each binary far-end spectrum. The sum of each resultant binary spectrum is determined and the far-end binary spectrum that produces highest value after the summation is considered to be the best match. The delay is then estimated based on the frame number and frame size.

Generally, the estimated delay value will be approximately constant during a call session and may vary slightly across sessions. Thus, the delay estimate may be carried out initially at the start of a session only. The delay may be re-estimated based on if there is a change in the platform, for example, when a mobile user switches to a hands-free mode. The delay estimate could also be carried out periodically. If it is determined that the delay is frequently varying during a session, the platform may be considered to be highly non-linear, irrespective of the non-linearity estimate carried out by the path estimator 202. In this case, the delay estimator 401 can cause the tuner 203 to set the target power level to an appropriate level during near-end signal periods, such as double talk.

The signal detector 402 detects echo-only periods, near-end signal only periods and double talk periods. The signal detector 402 may comprise an adaptive filter 403 (which may be a short adaptive filter having a short filter length of, for example, about 50 coefficients) and a convergence detector 404. A far-end signal, which has been compensated for delay based on the delay estimate determined by the delay estimator 401, and the microphone signal are fed in to the adaptive filter 403, which continuously adapts its coefficients. After processing each frame of the delay compensated far-end signal and the microphone signal, the convergence of the adaptive filter is estimated using the cosine of the angle between an error signal e(n) and the microphone signal d(n), where n represents a sample number of the signals. The error signal e(n) is outputted by the adaptive filter 403 and is the difference between the microphone signal and the estimated far-end signal. The residual echo and echo will be uncorrelated and hence the cosine of the angle between them is near to zero. But, the cosine of the angle between the microphone signal and error signal will be away from the zero during double talk depending on the near-end to echo ratio.

The projection of error signal e(n) on the microphone signal d(n) for Ith frame is given as:

$$Pem(I) = \sum_{n=0}^{m} \left( \frac{|e(n)||d(n)|}{|e(n) \cdot d(n)|} \right)$$

where m represent the frame size.

If the Pem(I)<TH2, it indicates that current frame of microphone signal contains only echo, otherwise it contains a near-end signal and/or ambient background noise. TH2 is a threshold value that may be experimentally estimated. Further known voice activity detection methods can be used to discriminate between near-end speech and background noise. The frames of the microphone signal indicated as containing only echo are identified to the path estimator 202.

The path estimator 202 estimates the degree of non-linearity of the echo path. The echo path may be considered to be path taken by the far-end signal from being provided to the loudspeaker to being received from the microphone. Thus the echo path is dependent on the linearity of the near-end platform. One method of measuring the degree of non-linearity is by cross correlating the delay compensated far-end and the echo only frames of the microphone signal to determine how similar the signals are. If the correlation between echo and far-end signals are high, then the echo path is highly linear. If the correlation is low, then there is significant non-linearity present in the echo path. Cross correlation would provide a clear peak for a linear platform and a random distribution for highly non-linear platform.

The correlation similarity is estimated for frames of the microphone signal that do not contain near-end speech (i.e. the echo-only frames). To reduce the complexity involved in determining how similar the echo and far-end signals are, the far-end and microphone signals may be decimated by 2 before estimating their correlation.

The correlation similarity may be a ratio between accumulated energy of a number of correlation coefficients (e.g. 7 correlation coefficients) near to a peak correlation region and the total energy of the coefficients. The correlation similarity may be estimated as follows:

a) The cross correlation coefficients, $X_{corr}$ (I, i) (where I is the Ith frame and i is the index of correlation coefficient vector $X_{corr}$ of frame I), between the near-end and the delay compensated far-end frames are determined.

b) The total energy, T(I), of the sum of the square of each of the coefficients $X_{corr}$ (I, i) is determined.

c) Peak energy, D(I), of the sum of the square of the peak coefficient and its adjacent coefficients is determined. For example, if the number of coefficients is 7, then 3 coefficients before and 3 coefficients after the peak and the peak are used to determine D(I).

d) The correlation similarly factor is determined by dividing D(I) by T(I).

To compensate for any tolerance error in the delay compensation, and for greater accuracy, the correlation measurement may additionally be done with multiple frames from a stored history of the far-end and microphone signal frames.

The determined correlation similarity may be quantised into one of the example predefined ranges shown in Table 1. Other suitable ranges may be used.

TABLE 1

| Similarity Factor Range | Non-Linearity |
| --- | --- |
| >0.9 | Low |
| 0.75-0.9 | Avg |
| 0.66-0.75 | Avg+ |
| 0.55-0.66 | High |
| 0.4-0.55 | High+ |
| 0.3-0.4 | Very High |
| <0.3 | Extremely High |

The determined non-linearity of the platform is provided to the tuner 203, which adapts the target level for the controller 204 in dependence on the non-linearity during the presence of a near-end signal. The tuner 203 may, for example, use a look-up table to determine which target level to adapt to in dependence on the non-linearity. Table 2 is an example of such a look-up table. Other suitable values may be used.

TABLE 2

| Non-Linearity | Target level adaption during near-end signal periods |
| --- | --- |
| Low | Default value |
| Avg | Default value |
| Avg+ | 0 dB |
| High | −6 dB |
| High+ | −12 dB |
| Very High | −20 dB |
| Extremely High | −30 dB |

Therefore, in this example, as the non-linearity of the echo path increases, the target power level used by the controller 204 during periods of near-end signal and periods of double talk decreases. This is because when the near-end signal is present, the echo cancellation is poor at adapting to the echo, and in particular echo cancellation performs poorly if the echo path is more non-linear. Therefore, for highly non-linear echo paths, the gain applied to the far-end signals by the controller 204 is low to thereby reduce the amount of unpredictable echo in the microphone signal; whereas for more linear echo paths the gain applied by the controller 204 may be higher.

Measures other than the correlation similarity may be used to determine the degree of non-linearity. For example, the variation in the delay of the echo path, as mentioned above may be used and appropriate target levels may be determined for different degrees of variation. For example, if there is little variation, then the default target level may be used. If there is a large variation, then a target level of −30 db may be used.

The far-end and microphone signals may be down sampled prior to being provided to the signal identifier 201 and the path estimator 202. This can help reduce the amount of processing required to determine an appropriate target level. For example, the signals may be sampled to 4 kHz or less before processing.

Figure 6:
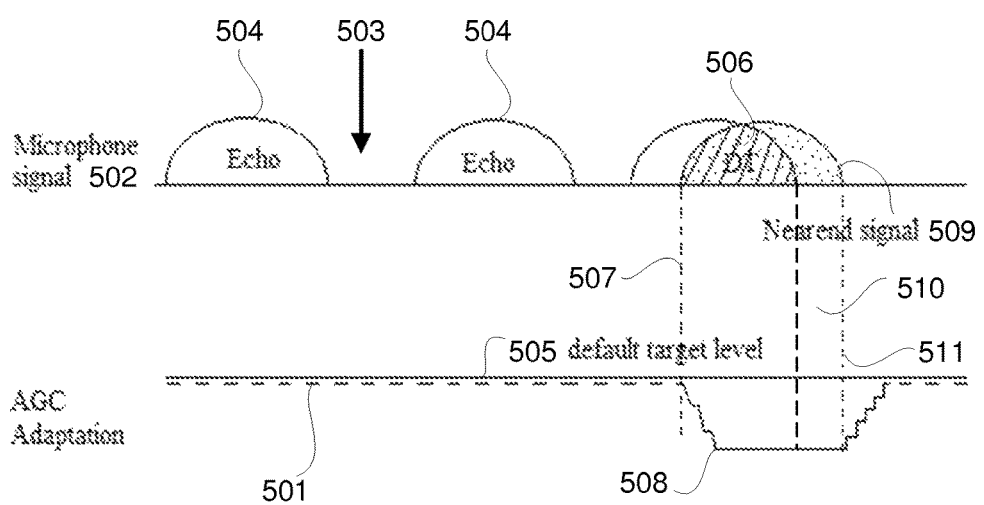
FIG. 6 shows an example of gain adaption.

FIG. 6 is a diagram demonstrating the how the target level 501 provided by the tuner 203 to the controller 204 is adapted in dependence on the microphone signal 502. During periods where the microphone does not detect any signals 503 and echo only periods 504, the target level 501 remains at the default level 505. For illustrative purposes, when the target level 501 is the default value, the target level 501 is illustrated as being slightly below the default level 505 rather than at the default level 505. When a near-end signal 509 is detected (in this case, during double talk (DT) 506) (e.g. by signal detector 402) at 507, the target level is reduced to the adapted target level 508, which is determined in dependence on the degree of non-linearity (as described above). As shown in FIG. 6, the target level may be reduced from the default value to the adapted value progressively. The rate at which the target level is reduced may depend on the difference between the default and adapted values. Generally, a larger difference between the default and adapted values would require a faster rate. Once the target level is equal to the adapted value it is maintained until either the end of double talk or the end of the near-end signal 509. As shown in the figure by period 510, the target level is maintained at the adapted level 508 when double talk ends and only the near-end signal 509 is present. At the end of the near-end signal (as illustrated by dashed line 511), the target level is increased from the adapted value to the default value. The rate of increase of the target level from the adapted value to the default value may be the same or different to the rate at which the target value is reduced. Preferably, the rate of increase is slower than the rate of decrease, as shown in FIG. 6. For example, the rate of reduction may be about 40 dB/sec and rate of increase may be about 16 dB/sec. This helps provide a gradual increase in the far-end signal volume at the near-end speaker and avoids an uncomfortable, abrupt increase in volume for the user if the rate of increase was fast. Alternatively, the target level can be adapted to/from the default level immediately rather than progressively.

As mentioned above, non-linear platforms can cause problems for echo cancellers, which in turn leads to degradation in the quality of the near-end signal received at the far-end. By providing a lower target power level for the controller 204, the gain applied to the received far-end signal is reduced during near-end signal periods (which includes double talk periods) for highly non-linear platforms. This leads to a decrease in the volume of the far-end signal outputted by the device loudspeaker. Thus the non-linear echo signal is highly attenuated and so little or no energy from the echo is picked up by the microphone and so the NLP of the echo canceller is able to keep its threshold to a low level and avoid having to implement a high threshold, which would degrade the near-end signal (as mentioned above). Thus the gain control system 200 is capable of advantageously effecting the operation of the echo canceller, whilst being independent to the echo canceller.

The structures shown in FIGS. 2, 3 and 5 (and indeed all the block apparatus diagrams included herein) are intended to correspond to a number of functional blocks in an apparatus. This is for illustrative purposes only. FIGS. 2, 3 and 5 are not intended to define a strict division between different parts of hardware on a chip or between different programs, procedures or functions in software. In some embodiments, some or all of the algorithms described herein may be performed wholly or partly in hardware. In many implementations, at least part of the gain control system may be implemented by a processor acting under software control (e.g. the CPU or DSP of a communication device). Any such software is preferably stored on a non-transient computer readable medium, such as a memory (RAM, cache, hard disk etc) or other storage means (USB stick, CD, disk etc).

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A gain control system arranged to apply gain to a far-end signal in a communication device, the system comprising:
   a signal identifier configured to detect a presence of an echo of the far-end signal in a microphone signal outputted by a microphone; and
   a path estimator configured to estimate a characteristic of an echo path of the detected echo, wherein:

the signal identifier is further configured to detect a presence of a near-end signal component from the microphone signal; and in response to detecting the presence of a near-end signal component, the gain control system is configured to reduce the gain applied to the far-end signal in dependence on the estimated characteristic of the echo path.

2. A gain control system as claimed in claim 1, wherein, in response to detecting an absence of the near-end signal component, the gain control system is configured to increase the gain applied to the far-end signal from an amount of gain applied when the presence of a near-end signal component has been detected.

3. A gain control system as claimed in claim 2, wherein the gain is reduced at a first rate and increased at a second rate, the first rate being greater than the second rate.

4. A gain control system as claimed in claim 2, wherein the applied gain is increased to a default gain value.

5. A gain control system as claimed in claim 1, wherein the path estimator is configured to correlate the detected echo of the far-end signal with the far-end signal so as to determine a measure of similarity between the echo and the far-end signal.

6. A gain control system as claimed in 5, wherein the characteristic is estimated in dependence on the measure of similarity.

7. A gain control system as claimed in claim 6, wherein the characteristic is a degree of non-linearity of the echo path.

8. A gain control system as claimed in claim 7, wherein the gain is reduced so as to output a far-end signal having, in dependence on the degree of non-linearity, a predetermined power.

9. A gain control system as claimed in claim 1, wherein the characteristic is a variation of a delay in the echo path over time.

10. A gain control system as claimed in claim 1, wherein the presence of the echo of the far-end signal is detected during echo-only periods.

11. A gain control system as claimed in claim 1, wherein the presence of the near-end signal component is detected during double talk.

12. A gain control system as claimed in claim 1, wherein the gain control system is configured to control a volume of the far-end signal to be outputted by a loudspeaker of the communication device.

13. A method for applying gain to a far-end signal in a communication device, the method comprising:
detecting a presence of an echo of the far-end signal in a microphone signal;
estimating a characteristic of an echo path of the detected echo;
detecting a presence of a near-end signal component from the microphone signal; and
in response to detecting the near-end signal component, reducing the gain applied to the far-end signal in dependence on the estimated characteristic of the echo path.

14. A method as claimed in claim 13, further comprising, in response to detecting an absence of the near-end signal component, increasing the gain applied to the far-end signal from the reduced gain applied in response to the detection of the presence of a near-end signal.

15. A method as claimed in claim 13, wherein estimating a characteristic of an echo path comprises correlating the detected echo of the far-end signal with the far-end signal so as to determine a measure of similarity between the echo and the far-end signal.

16. A method as claimed in claim 13, wherein the characteristic is a degree of non-linearity of the echo path.

17. A method as claimed in claim 16, wherein the gain is reduced so as to output a far-end signal having, in dependence on the degree of non-linearity, a predetermined power.

18. A non-transitory machine readable storage medium having stored therein computer-executable instructions that when executed cause at least one processor to:
detect a presence of an echo of a far-end signal in a microphone signal;
estimate a characteristic of an echo path of the detected echo;
detect a presence of a near-end signal component from the microphone signal; and
in response to detecting the presence of the near-end signal component, reduce a gain applied to the far-end signal in dependence on the estimated characteristic of the echo path.

* * * * *